(12) United States Patent
Lehane (10) Patent No.: US 10,481,573 B2
(45) Date of Patent: Nov. 19, 2019

(54) MULTI-CHANNEL DIGITAL TRIGGER WITH COMBINED FEATURE MATCHING AND ASSOCIATED METHODS

(71) Applicant: Keysight Technologies, Inc., Santa Rosa, CA (US)

(72) Inventor: Andrew Robert Lehane, Kinross-shire (GB)

(73) Assignee: Keysight Technologies, Inc., Santa Rosa, CA (US)

( * ) Notice: Subject to any disclaimer, the term of this patent is extended or adjusted under 35 U.S.C. 154(b) by 190 days.

(21) Appl. No.: 14/815,249

(22) Filed: Jul. 31, 2015

(65) Prior Publication Data
US 2017/0031336 A1 Feb. 2, 2017

(51) Int. Cl.
*G05B 19/045* (2006.01)
*G01R 13/02* (2006.01)

(52) U.S. Cl.
CPC ....... *G05B 19/045* (2013.01); *G01R 13/0254* (2013.01)

(58) Field of Classification Search
None
See application file for complete search history.

(56) References Cited

U.S. PATENT DOCUMENTS

| | | | |
|---|---|---|---|
| 4,858,142 A * | 8/1989 | Jenq | G01R 31/3177 702/71 |
| 5,201,395 A | 4/1993 | Takizawa et al. | |
| 5,857,980 A | 1/1999 | Wilson | |
| 6,473,701 B1 * | 10/2002 | Tallman | G01R 13/0272 324/121 R |
| 7,133,463 B1 * | 11/2006 | Amirkhany | G06F 17/141 375/295 |
| 8,732,435 B1 | 5/2014 | Chou et al. | |
| 9,268,321 B2 * | 2/2016 | Lehane | G01R 13/0272 |
| 9,618,923 B2 | 4/2017 | Lehane et al. | |
| 10,037,689 B2 * | 7/2018 | Taylor | G08G 1/0141 |

(Continued)

FOREIGN PATENT DOCUMENTS

WO    WO2002015405 A2    2/2002

OTHER PUBLICATIONS

Co-pending U.S. Appl. No. 14/313,884.

(Continued)

*Primary Examiner* — Crystal L Hammond (57) ABSTRACT

A method of operating a measurement instrument, such as a digital oscilloscope, includes receiving multiple analog input signals from a measurement target over respective channels, converting the analog input signal on each channel into a respective digital signal, and comparing signal values of the digital signal on each channel to at least one threshold to generate a stream of levels for each channel. The method includes combining the stream of levels for each channel into a combined stream of levels that reflects combined features of the multiple analog input signals, detecting a pattern in the combined stream of levels using a combined-feature matching procedure implemented by hardware, such as a Finite State Machine (FSM), and triggering the measurement instrument according to a result of the combined-feature matching procedure.

19 Claims, 5 Drawing Sheets

(56) References Cited

U.S. PATENT DOCUMENTS

| | | | |
|---|---|---|---|
| 2003/0210487 A1* | 11/2003 | Oda | G11B 5/09 |
| | | | 360/27 |
| 2005/0134307 A1 | 6/2005 | Stojanovic et al. | |
| 2006/0106317 A1 | 5/2006 | McConnell et al. | |
| 2007/0200550 A1* | 8/2007 | Corredoura | G01R 13/0254 |
| | | | 324/121 R |
| 2008/0273636 A1 | 11/2008 | Zhu et al. | |
| 2009/0077404 A1 | 3/2009 | Herring et al. | |
| 2011/0134979 A1 | 6/2011 | Rule | |
| 2014/0232582 A1 | 8/2014 | Lian et al. | |
| 2014/0370833 A1 | 12/2014 | Din et al. | |
| 2015/0057978 A1 | 2/2015 | Rule et al. | |
| 2015/0370234 A1* | 12/2015 | Lehane | G01R 13/0272 |
| | | | 326/46 |
| 2017/0031159 A1* | 2/2017 | Pugh | A61B 5/4809 |

OTHER PUBLICATIONS

Co-pending U.S. Appl. No. 14/578,198, filed Dec. 19, 2014.
Notice of Publication dated Dec. 24, 2015 for U.S. Appl. No. 14/313,884, 1 pg.
Notice of Allowance dated Oct. 2, 2015 for U.S. Appl. No. 14/313,884, 9 pgs.
Final Office Action dated Sep. 15, 2016 for U.S. Appl. No. 14/578,198, 14 pgs.
Non-Final Office Action dated Mar. 23, 2016 for U.S. Appl. No. 14/578,198, 5 pgs.
Notice of Publication dated Jun. 23, 2016 for U.S. Appl. No. 14/578,198, 1 pg.
Non-Final Office Action dated Jul. 15, 2016 for U.S. Appl. No. 14/957,491, 11 pgs.
Notice of Allowance dated Nov. 14, 2016 for U.S. Appl. No. 14/957,491, 8 pgs.
Non of Publication dated Mar. 24, 2016 for U.S. Appl. No. 14/957,491, 1 pg.
Chinese Notice of Allowance dated Apr. 24, 2019 with English translation, 4 pgs.
Chinese Office Action dated Jun. 14, 2019 with English translation, 10 pgs.

* cited by examiner

| Bit from Channel 1 | Bit from Channel 2 | Two bit value | Channel 1 | Channel 2 |
|---|---|---|---|---|
| 0 | 0 | 0 | L | L |
| 0 | 1 | 1 | L | H |
| 1 | 0 | 2 | H | L |
| 1 | 1 | 3 | H | H |

FIG. 5

| Input to FSM | Input from channel 1 | Input from channel 2 | |
|---|---|---|---|
| \x0 | 00 | 00 | Both Low |
| \x1 | 00 | 01 | Chan 1 Low, Chan 2 Medium |
| \x2 | 00 | 10 | Chan 1 Low, Chan 2 High |
| \x3 | 00 | 11 | Not Used |
| \x4 | 01 | 00 | Chan 1 Medium, Chan 2 Low |
| \x5 | 01 | 01 | Both Medium |
| \x6 | 01 | 10 | Chan 1 Medium, Chan 2 High |
| \x7 | 01 | 11 | Not Used |
| \x8 | 10 | 00 | Chan 1 High, Chan 2 Low |
| \x9 | 10 | 01 | Chan 1 High, Chan 2 Medium |
| \xa | 10 | 10 | Both High |
| \xb | 10 | 11 | Not Used |
| \xc | 11 | 00 | Not Used |
| \xd | 11 | 01 | Not Used |
| \xe | 11 | 10 | Not Used |
| \xf | 11 | 11 | Not Used |

MULTI-CHANNEL DIGITAL TRIGGER WITH COMBINED FEATURE MATCHING AND ASSOCIATED METHODS

BACKGROUND

Measurement instruments that measure, record, process a signal, and display the results of the processing are known to the art. For example, a digital oscilloscope measures the amplitude of a signal as a function of time and displays a portion of the observed signal as a graph of signal amplitude as a function of time. Modern digital oscilloscopes can measure a signal at a rate of close to 100 Gigasamples/second in each of a plurality of measurement channels. To generate data at this rate, the signal is typically digitized using a bank of sample and hold circuits that sample the signal in successive time slots. Each sample and hold circuit feeds a high speed analog-to-digital converter (ADC) that stores its output in a high speed memory bank that is assigned to that ADC.

Only a small fraction of this data is typically of interest. Hence, some form of "trigger" is utilized to define the beginning of a region of interest in the signal. When the trigger is detected, the instrument records the signal from the trigger to some point in time that depends on the storage capacity of the memory banks. Simple triggers such as detecting a rising edge in the signal can be implemented in hardware in real time. A trigger system that can consume samples as fast as the bank of ADCs can generate the samples will be referred to as a real time trigger (RTT) system. However, in conventional approaches, more complex triggers rely on storing a data sequence and then examining the sequence using hardware that is too slow to operate in real time. In such schemes, a real time trigger is used to define some preliminary trigger event. The instrument then records the data from that trigger point to some predetermined number of samples. The recorded data is then examined by a more complex trigger system to determine if the more complex trigger is present.

Such secondary trigger systems are referred to as post acquisition triggers (PATs). If the complex trigger is found, the instrument displays the data starting with that trigger. If the complex trigger pattern is not found, the process is repeated. During the time the PAT is operating on the stored data, the instrument is not acquiring any new data, and hence, the instrument is "blind" for that period of time. The blind time is typically a large fraction of the total operating time, and hence, a signal of interest can be lost.

In an RTT the trigger event is detected at the (real time) rate of the input signal, using dedicated triggering hardware and/or an ADC output data stream. This trigger approach never misses a trigger event. For a PAT, the trigger event is detected after the ADC data has been stored in a memory. Software and/or hardware examine the ADC data stored in memory, looking for a specified trigger condition. This trigger method is alternatively referred to as a "software trigger". There is no guarantee that the trigger event will have been stored in the memory. It is also possible for the trigger event to occur when the ADC is not storing data to the memory; this is often known as dead time. Thus, this trigger method misses trigger events, which is an undesirable behavior.

A hardware RTT offers a high level of bandwidth, but, in conventional approaches, it may have limited ability to support complex triggers. Software triggers PAT, however, may support much richer functionality and complexity, but support less bandwidth.

Oscilloscopes provide trigger modes, such as setup violation or "edge then edge" triggers that require trigger events to be correlated across two or more channels. As discussed above, oscilloscopes today generally use analog trigger circuitry. These circuits may be expensive to design and manufacture, and also may be difficult to integrate into the oscilloscope because of the different timings of the trigger and the digital sample path. Of course, moving the triggering from the analog domain into the digital domain may address these issues. As such, the use of FSMs for digital triggering may include the use of FSMs being cascaded to correlate trigger events from separate channels.

For example, with reference to FIG. 1, an approach including the use two channel FSMs (FSM1 and FSM2) and a correlator FSM (FSM3) will be described. Each of the channel FSMs fires a trigger event when it detects a sample sequence of interest. The correlator FSM has rules that define how the individual channel trigger events combine to form the actual trigger. This approach may provide flexible triggering modes with the appropriate FSM configurations.

A disadvantage with this approach is that the amount of inputs to the correlator FSM grows as the number of channels increases. Also, since a third FSM, i.e. the correlator FSM (FSM3), is needed to correlate the output, the cost is increased.

There may be a general need for digital triggers for use with any combination of channel number, number of levels and data rate.

SUMMARY

In accordance with a representative embodiment, a method of operating a measurement instrument includes receiving multiple analog input signals from a measurement target over respective channels, converting the analog input signal on each channel into a respective digital signal, and comparing signal values of the digital signal on each channel to at least one threshold to generate a stream of levels for each channel. The method includes combining the stream of levels for each channel into a combined stream of levels that reflects combined features of the multiple analog input signals, detecting a pattern in the combined stream of levels using a combined-feature matching procedure implemented by hardware, and triggering the measurement instrument according to a result of the combined-feature matching procedure.

In certain embodiments, the at least one threshold comprises a plurality of thresholds for each channel. Also, different thresholds and/or a different number of thresholds, of the plurality of thresholds, may be selectable for each channel. The stream of levels for each channel may include between 2 to 8 levels.

In certain embodiments, the hardware is a Finite State Machine (FSM) configured to perform the combined-feature matching procedure. The FSM may detect the pattern in the combined stream of levels using regular expressions.

Another aspect is directed to a method of generating a digital trigger from multi-channel analog inputs, the method including: converting an analog input signal on each channel into a respective digital signal; comparing signal values of the digital signal on each channel to at least one threshold for each channel to generate a stream of levels for each channel; combining the stream of levels for each channel into a combined stream of levels; detecting a pattern in the combined stream of levels using a Finite State Machine (FSM) implementing a combined-feature matching procedure; and generating the digital trigger according to a result of the combined-feature matching procedure.

Another aspect is directed to a multi-channel digital trigger device for a measurement instrument. The multi-channel digital trigger device includes an analog to digital converter (ADC) configured to convert analog input signals on each of multiple channels into a respective digital signal, and a comparator associated with each channel and configured to compare signal values of the digital signal on each channel to at least one threshold to generate a stream of levels for each channel. A multi-channel trigger unit comprises hardware configured to combine the stream of levels for each channel into a combined stream of levels that reflects combined features of the multiple analog input signals, detect a pattern in the combined stream of levels using a combined-feature matching procedure, and generate a trigger according to a result of the combined-feature matching procedure.

In certain embodiments, there may be a plurality of thresholds for each channel. Also, different thresholds and/or a different number of thresholds, of the plurality of thresholds, may be selectable for each channel. The stream of levels for each channel may include between 2 to 8 levels.

In certain embodiments, the hardware may be a Finite State Machine (FSM) configured to perform the combined-feature matching procedure. The FSM may be configured to detect the pattern in the combined stream of levels using regular expressions, for example.

The embodiments provide digital triggers for use with any combination of channel number, number of levels and data rate while keeping in mind the complexity constraints and associated costs of a device. As would be appreciated by those skilled in the art, increasing the complexity with the number of channels and levels may result in a decrease in the associated data rate.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

It will be understood that when an element is referred to as being "on", "connected" or "coupled" to another element, it can be directly on, connected or coupled, to the other element, or intervening elements may be present.

As mentioned above, in oscilloscope technology, two types of trigger mechanisms include a Real-Time-Trigger (RTT) and Post-Acquired-Trigger (PAT). In an RTT the trigger event is detected at the (real time) rate of the input signal, using dedicated triggering hardware and/or an ADC output data stream. This trigger approach may not miss a trigger event, although only a fraction of the events may be selected for display on the screen. For a PAT, the trigger event is detected after the ADC data has been stored in a memory. Software and/or hardware examine the ADC data stored in memory, looking for a specified trigger condition. This trigger method is alternatively referred to as a "software trigger". There is no guarantee that the trigger event will have been stored in the memory. It is also possible for the trigger event to occur when the ADC is not storing data to the memory; this is often known as dead time. Thus, this trigger method misses trigger events, which is an undesirable behavior.

The two types of triggers are supported because the underlying hardware and software has engineering constraints based upon the complexity, throughput/bandwidth and functionality.

In co-pending U.S. patent application U.S. Ser. No. 14/313,884, an approach for using finite state machines (FSMs) to implement a trigger system for complex trigger criteria is disclosed. In that invention, the digitized signal values are first converted to a sequence of symbols that have much fewer states than the digitized signal values. For example, a 12 bit ADC-generated value can be reduced to three symbols, L, M, and H by comparing the signal values to three ranges of values. A trigger is defined as a sequence in the symbol sequence that satisfies a predetermined regular expression. The FSM-implemented trigger system operates on the resultant sequence of symbols.

In the present approach described below, the triggers can be implemented in either hardware (RTT) or software (PAT), and the same mechanism based upon a FSM is used. However, the description is primarily directed to the use of an RTT and the associated increased complexity of the triggers due to the advantages of the features of the present embodiments.

Figure 2:
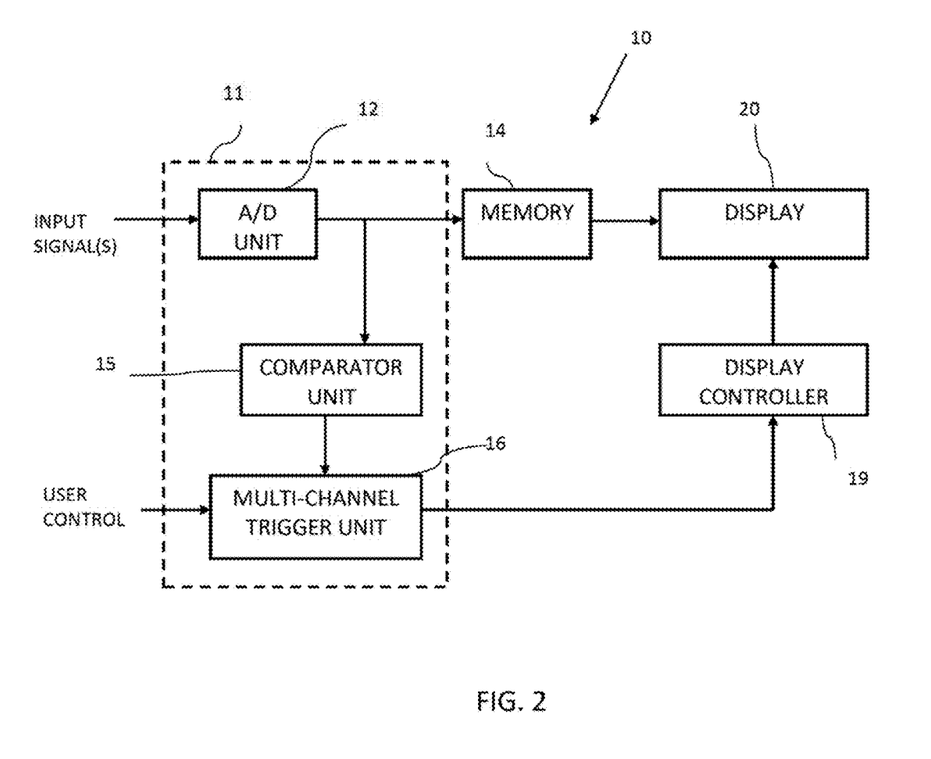
FIG. 2 is a block diagram illustrating an embodiment of a digital oscilloscope including a multi-channel trigger unit in accordance with features of the present invention.

Referring now to FIG. 2, the manner in which the present invention provides its advantages can be more easily understood with respect to an exemplary digital oscilloscope system 10 that utilizes a digital trigger device 11 in accordance with features of the present approach. The digital oscilloscope system 10 utilizes an FSM-based trigger device 11 to implement a real time trigger (RTT). The input signal(s) to digital oscilloscope 10 is digitized by an analog-to-digital converter (ADC) unit 12, which may include a bank of ADCs. To provide sufficient time resolution, for example, each ADC may include a sample and hold circuit that has a very narrow sampling window. The window is much shorter than the time needed to digitize the captured waveform. Hence, successive ADCs in the bank may capture signal values that are displaced in time from one another so as to provide a continuous series of samples separated by the width of the sampling window in time.

The output(s) from the ADC unit 12 (e.g. from each ADC) is stored in a memory 14, for example, including corresponding memory banks. The details of the banking of the ADCs and the banks in the memory have been omitted from the drawing to simplify the drawing and following discussion. The ADC unit 12 output is monitored by a comparator unit 15 that generates a symbol from each ADC measurement. The symbols (or words) are input to a multi-channel trigger unit 16, which may be implemented by a Finite State Machine (FSM), as discussed.

If the multi-channel trigger unit 16 finds a match to the trigger sequence, display controller 19 displays the corresponding A/D measurements on display 20 starting from a point defined by the trigger sequence. User control signals, e.g. to select trigger events for display, may be provided to the multi-channel trigger unit 16, e.g. via a user interface (not shown). The multi-channel trigger unit 16 may be coupled to display controller 19 and display 20, e.g. via a hardware interface (not shown).

The FSM can be implemented on a field-programmable gate array (FPGA) or potentially in an application-specific integrated circuit (ASIC), for example, including a processor and/or memory. The technology could be programmed via memory, for example a BRAM on an FPGA, it can hold multiple active patterns. By having several FSMs the approach could operate across input channels with different classifications for thresholds for each channel. Each FSM could support multiple levels for each active trigger on that channel as well as triggers that can rearm immediately ready for the next incoming sample.

A "processor" as used herein encompasses an electronic component which is able to execute a program or machine executable instruction. The processor may for instance be a multi-core processor. A processor may also refer to a collection of processors within a single computer system or distributed amongst multiple computer systems. Many programs have their instructions performed by multiple processors that may be within the same computing device or which may even be distributed across multiple computing devices.

Generally, a controller can be implemented in numerous ways (e.g., such as with dedicated hardware) to perform various functions discussed herein. A "processor" is one example of a controller, which uses one or more microprocessors that may be programmed using software (e.g., microcode) to perform various functions discussed herein. A controller may be implemented with or without employing a processor, and also may be implemented as a combination of dedicated hardware to perform some functions and a processor (e.g., one or more programmed microprocessors and associated circuitry) to perform other functions. Examples of controller components that may be employed in various embodiments of the present disclosure include, but are not limited to, conventional microprocessors, microcontrollers, application specific integrated circuits (ASICs), and field-programmable gate arrays (FPGAs).

In various implementations, a controller may be associated with one or more storage media (generically referred to herein as "memory," e.g., volatile and non-volatile computer memory such as random-access memory (RAM), read-only memory (ROM), programmable read-only memory (PROM), electrically programmable read-only memory (EPROM), electrically erasable and programmable read only memory (EEPROM), universal serial bus (USB) drive, floppy disks, compact disks, optical disks, magnetic tape, etc.). In some implementations, the storage media may be encoded with one or more programs that, when executed on the controller, perform at least some of the functions discussed herein. Various storage media may be fixed within the controller or may be transportable, such that the one or more programs stored thereon can be loaded into a processor or controller so as to implement various aspects of the present teachings discussed herein.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a touch screen, keyboard, mouse, trackball, touchpad, pointing stick, graphics tablet, joystick, gamepad, webcam, headset, gear sticks, steering wheel, wired glove, wireless remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection. Ethernet connection, control voltage interface, MIDI interface, analog input interface, and digital input interface.

A 'display' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bistable display, Electronic paper, Vector display, Flat panel display, Vacuum fluorescent display (VF), Light-emitting diode (LED) displays, Electroluminescent display (ELD)), Plasma display panels (PDP), Liquid crystal display (LCD), Organic light-emitting diode displays (OLED), a projector, and Head-mounted display.

Figure 3:
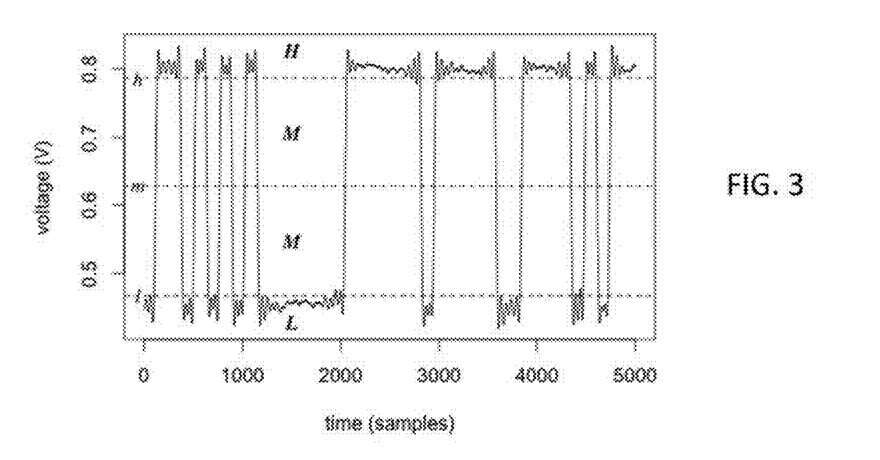
FIG. 3 is a timing diagram illustrating a two-state digital waveform and voltage thresholds

Referring additionally to FIG. 3, an example of an input signal as a tri-state digital waveform will be discussed. To simplify the following discussion, it will be assumed that each input signal value is converted to a symbol set having three voltage states, L, M, and H. A signal value that is less than a first threshold value is assigned the symbol L; a signal value that is between the first threshold and less than or equal to a second threshold is assigned the symbol M, and signal values that are greater than the second threshold are assigned the symbol H. The symbols L and H correspond to the low and high logic states of the waveform. The state M is the middle, logically indeterminate state. The various thresholds can be configured separately by the user of the oscilloscope.

Typical features of interest (i.e. to be identified) in the waveform, include, for example: State transitions (or just "transitions" for brevity) wherein the waveform, having been established in one of the logic states, switches to the other state and becomes established there (e.g. in FIG. 3, the first state transition is near sample 115); Glitches wherein the waveform, having been established in one logic state, switches to the other state, but not long enough to be considered established (e.g. there are no glitches in FIG. 3); and Runt pulses wherein the waveform, having been established in one logic state, moves into the indeterminate region but then returns to the first logic state without ever having crossed the other logic state threshold (e.g. in FIG. 3, two runts are visible near sample 1950, and one runt each near samples 2800 and 4600).

The trigger patterns that may be defined in the present invention include patterns that can be defined by regular expressions. For the purposes of the present discussion, a regular expression is defined to be a sequence of characters that defines a search pattern. Given a regular expression, an FSM that executes the search so defined exists, and there are procedures for automatically generating that FSM. It should also be noted that there is more than one FSM that is capable of performing the search for any given regular expression.

An FSM is a machine that has a plurality of states connected by "directed edges". At each processing cycle, the FSM moves from its current state to a next state when a new input word is received by the FSM. Hence, each edge has one or more input values associated with that edge. When the FSM receives an input word having a value equal to the value corresponding to an edge, and the FSM is in the state associated with the input side of the edge, the FSM changes to the state associated with the output side of the edge. The FSM then proceeds to process the next input word. Certain transitions give rise to the FSM reporting a trigger match that includes information associated with the transition. The transition may be the entry into a particular state or the entry into that state by a specified edge. For the purposes of the present discussion, the processing cycle is complete when the FSM has moved to its new state and made any required reports.

As noted above, a regular expression is defined to be a sequence of characters that defines a search pattern. Each character in the expression is either a regular character with its literal meaning or one of a predetermined number of metacharacters that have a special meaning. For example, the metacharacter "|" denotes an alternative. The regular expression "a|b" is satisfied by a or b. The metacharacters "?", "*", and "+" quantify the preceding element. Metacharacter "?" is satisfied if the preceding element occurs zero or one time, "*" is satisfied if the preceding element occurs zero or more times, and "+" is satisfied if the preceding element occurs one or more times. Many patterns of interest require the repetition of some string. The expression that is to be repeated is surrounded (grouped) by ( ) if there is more than one character, or more than one character range in the expression, or more than one sub-expression.

Metacharacters "[" and "]" are used to create character classes, such as [LMH], "^" is used to represent negation, i.e., [^L], everything but 'L'. To specify that the expression is to be repeated m times, {m} is used after the expression. To specify an expression that is to be repeated at least m or more times, {m,} is used after the expression. To specify a range between n and m, the expression is followed by {m,n}. To specify less than some value, {1,m,} or {0,m} is used after the expression.

In terms of this notation, a regular expression for a rising edge is "L+M*H", i.e., one or more Ls followed by zero or more Ms followed by an H. Similarly, a regular expression for a falling edge is "H+M*L". A regular expression for either a rising or falling edge is (H+M*L)|(L+M*H). Again, additional features of interest in defining trigger sequences may include state transitions, glitches, binary pulses and runt pulses, for example, as well as many other types.

Figure 4:
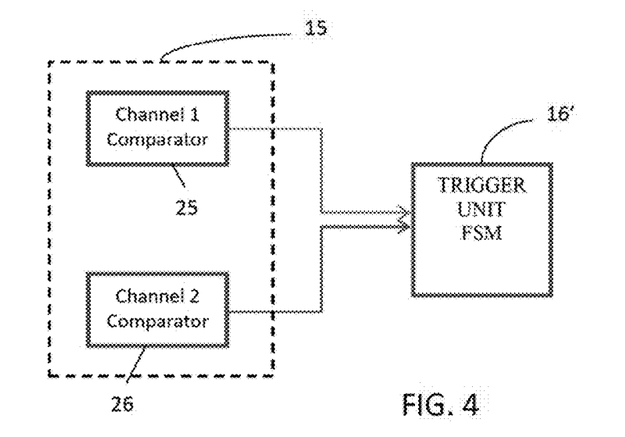
FIG. 4 is a block diagram illustrating further details of an embodiment of the multi-channel trigger unit of FIG. 2.

With additional reference to FIG. 4, an embodiment of the multi-channel digital trigger device 11 for a measurement instrument, such as the digital oscilloscope system 10, is described. In the present approach, no correlator is needed as comparator outputs from two channels are routed into the multi-channel digital trigger unit 16, e.g. a single FSM. This FSM contains rules defined in terms of the channel inputs concatenated together. Problems of increased input size associated with prior art approaches are reduced as the need for three FSMs is eliminated.

The multi-channel digital trigger device 11 may include the ADC unit 12 which is configured to convert analog input signals on each of multiple channels into a respective digital signal. As shown in the example embodiment of FIG. 4, the comparator unit 15 includes a comparator 25 and 26 associated with each channel (e.g. channel 1 and channel 2) and configured to compare signal values of the digital signal on each channel to at least one threshold to generate a stream of levels for each channel, as discussed above.

The multi-channel trigger unit 16' is implemented with hardware (i.e. the FSM) configured to combine the stream of levels for each channel into a combined stream of levels that reflects combined features of the multiple analog input signals. The trigger unit FSM 16' is configured to detect a pattern in the combined stream of levels using a combined-feature matching procedure, and to generate a trigger according to a result of the combined-feature matching procedure.

The example embodiment of FIG. 4 illustrates how a two channel, single level per channel, rising edge then rising edge trigger may be coupled. Each comparator 25, 26 has a single output wire which carries a 0 for Low and a 1 for High. A rising edge trigger on a channel would be defined as: [^L]*L+H which would detect the sequence 01 as the rising edge. The expressions could be written as: \x1*\x0+\x1 in terms of bit values.

Figure 1:
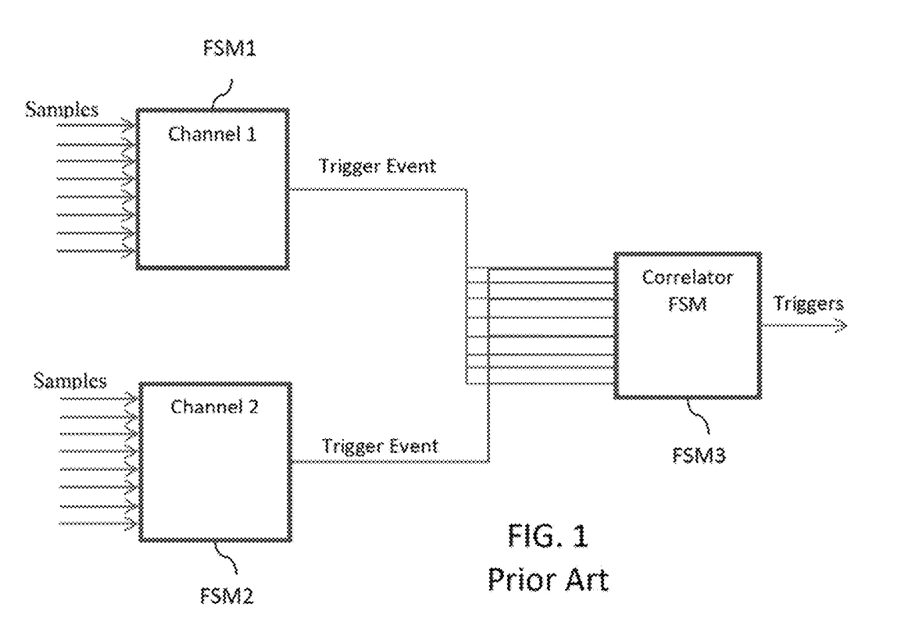
FIG. 1 is a block diagram showing a known digital trigger arrangement according to the prior art.

If there was a correlator present as in the example shown in FIG. 1, then the expression would be: \x1+\x2 which is a rising edge on channel 1 followed by a rising edge on channel 2. However, with only a single FSM, the expression should capture this feature using the combined inputs from each comparator 25, 26. In effect, instead of using a one bit input, there is now a two bit input and a two bit alphabet: \x0, \x1, \x2, \x3.

The two bit alphabet means that a rising edge on channel one is represented by: 01—the bits from channel 1; and **—the bits from channel 2, which should be ignored in this example. However, since these bits from channel 2 cannot be ignored, a rising edge on channel 1 is, beginning with the bit from channel 1 at the left: 01 00 or 01 01 or 01 10 or 01 11. In other words, all the possibilities on the channel we are ignoring are expressed. Concatenated inputs will be expressed as a word, channel 1 as the MSB.

Figure 5:
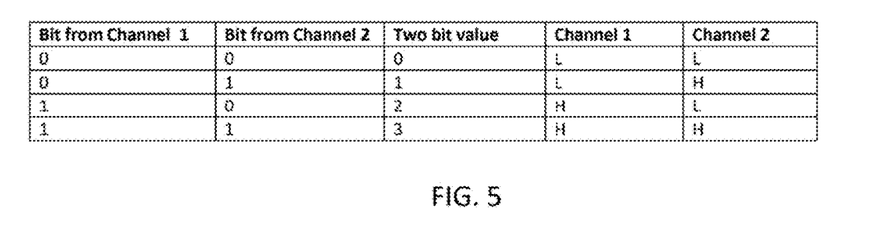
FIG. 5 is a table showing an example of 2-bit alphabet semantics for word inputs from concatenated inputs of two channels, with two levels, to the multi-channel trigger unit of FIG. 2.

In this example, the table in FIG. 5 summarizes the semantics of the alphabet and shows that for a Low or a High on either channel there are two possible values. For example, a Low on Channel 1 is represented by either 0 or 1, while on Channel 2 a Low is represented by 0 or 2.

Using the table (FIG. 5), the expression [^L]L+H for channel 1 can be translated into an expression based upon expected inputs from this alphabet:

$$H^* \quad L+ \quad H$$
$$(\backslash x2|\backslash x3)^*(\backslash x0|\backslash x1)+(\backslash x2|\backslash x3).$$

A similar analysis can be performed for channel 2 and the regular expression is:

$$H^* \quad L+ \quad H$$
$$(\backslash x2|\backslash x3)^*(\backslash x0|\backslash x2)+(\backslash x1|\backslash x3).$$

The combined regular expression for a rising edge on Channel 1 followed by a rising edge on Channel 2 is:

Rising edge channel 1     rising edge channel 2
$(\backslash x2|\backslash x3)^*(\backslash x0|\backslash x1)+(\backslash x2|\backslash x3) \ (\backslash x1|\backslash x3)^*(\backslash x0|\backslash x2)+(\backslash x1|\backslash x3).$ A time delay between these rising edges may be written:

$((\backslash x2|\backslash x3)^*(\backslash x|0|\backslash x1)+(\backslash x2|\backslash x3))\{Sample\ Count\}$
$(\backslash x1|\backslash x3)^*(\backslash x1|\backslash x2)+(\backslash x1|\backslash x3).$ This approach can be used can be used to derive triggers for any combination of channel number, number of levels and data rate. To process multiple symbols per clock cycle, corresponding pairs of comparators may have their outputs concatenated together to form a vector of samples, for example, 2 bits with the 2 bit alphabet.

Figure 6:
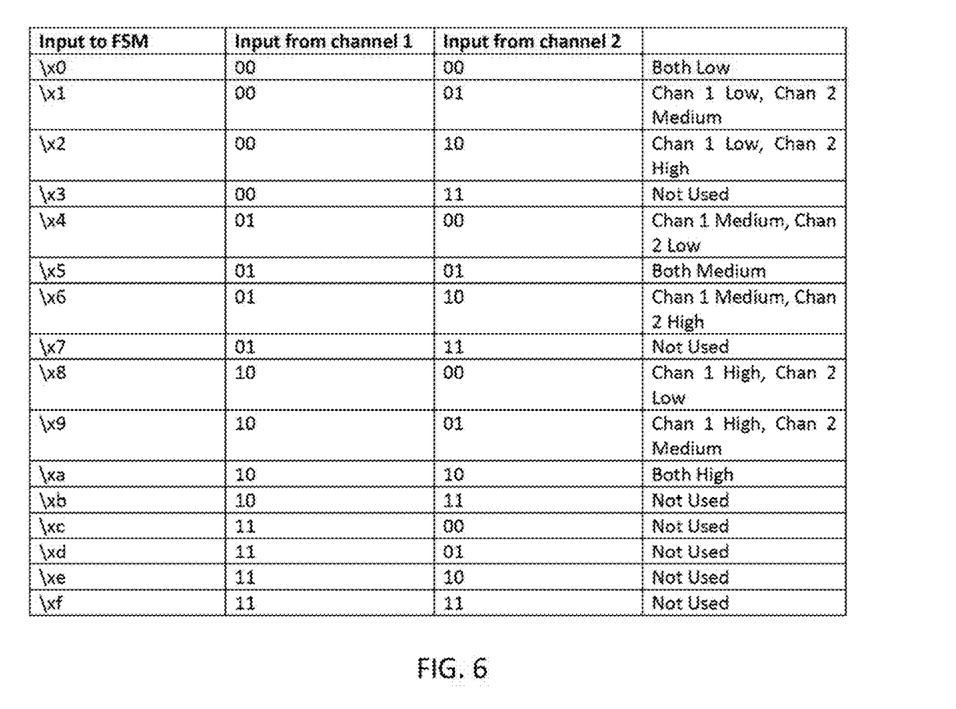
FIG. 6 is a table showing another example of 2-bit alphabet semantics for word inputs from concatenated inputs of two channels, with three levels, to the multi-channel trigger unit of FIG. 2.

FIG. 6 is a table showing another example of 2-bit alphabet semantics for word inputs from concatenated inputs of two channels, with three levels (e.g. L, M and H), to the multi-channel trigger unit of FIG. 2.

Figure 7:
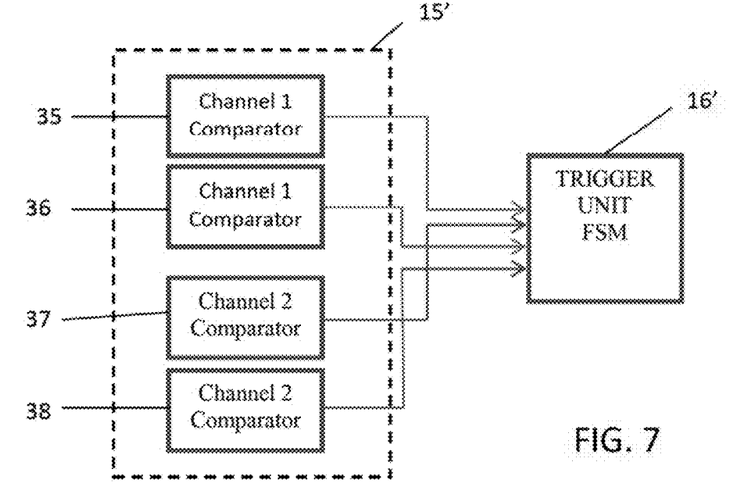
FIG. 7 is a block diagram illustrating further details of another embodiment of the multi-channel trigger unit of FIG. 2.

With additional reference to FIG. 7, the situation for a wide word input of two samples is shown, and this approach can be extended as needed. As shown in the example embodiment of FIG. 6, the comparator unit 15' includes pairs of comparators 35/36 and 37/38 associated with each channel (e.g. channel 1 and channel 2) and configured to compare signal values of the digital signal on each channel to at least one threshold to generate a stream of levels for each channel, as discussed above. At 3.2 GSa/s there would be 8 pairs of two bit inputs resulting in a total of 16 wires into the trigger unit FSM 16'.

So, a method aspect of the present invention is directed to operating a measurement instrument, such as the digital oscilloscope 10. The method includes receiving multiple analog input signals from a measurement target over respective channels (e.g. channel 1 and channel 2), converting the analog input signal on each channel into a respective digital signal, and comparing signal values of the digital signal on each channel to at least one threshold to generate a stream of levels for each channel. The method includes combining the stream of levels for each channel into a combined stream of levels that reflects combined features (e.g. rising or falling edge, state transitions, glitches, binary patterns and runt pulses) of the multiple analog input signals, detecting a pattern in the combined stream of levels using a combined-feature matching procedure implemented by hardware (e.g. the multi-channel digital trigger unit 16), and triggering the measurement instrument according to a result of the combined-feature matching procedure.

In certain embodiments, there are a plurality of thresholds (e.g. defining multiple levels L, M, H) for each channel. Also, different threshold values and/or a different number of thresholds, may be selectable by the user for each channel. For example, the stream of levels for each channel may include between 2 to 8 levels.

In certain embodiments of the method, the hardware of the multi-channel digital trigger unit 16 is a Finite State Machine (FSM) configured to perform the combined-feature matching procedure. Such an FSM may detect the pattern in the combined stream of levels using regular expressions.

Another aspect is directed to a method of generating a digital trigger from multi-channel analog inputs. The method includes converting an analog input signal on each channel into a respective digital signal, comparing signal values of the digital signal on each channel to at least one threshold for each channel to generate a stream of levels for each channel, and combining the stream of levels for each channel into a combined stream of levels. The method includes detecting a pattern in the combined stream of levels using regular expressions in a Finite State Machine (FSM) implementing a combined-feature matching procedure, and generating the digital trigger according to a result of the combined-feature matching procedure, for example, as discussed above.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method of operating a measurement instrument, the method comprising:
   receiving multiple analog input signals from a measurement target over respective channels;
   converting the analog input signal on each channel into a respective digital signal;
   comparing signal values of the digital signal on each channel to at least one threshold to generate a stream of levels for each channel;
   combining the stream of levels for each channel into a combined stream of levels that reflects combined features of the multiple analog input signals;
   detecting a pattern in the combined stream of levels using a combined-feature matching procedure implemented by hardware; and
   triggering the measurement instrument according to a result of the combined-feature matching procedure.

2. The method of claim 1, wherein the at least one threshold comprises a plurality of thresholds for each channel.

3. The method of claim 2, wherein different thresholds, of the plurality of thresholds, are selectable for each channel.

4. The method of claim 2, wherein a different number of thresholds, of the plurality of thresholds, are selectable for each channel.

5. The method of claim 1, wherein the stream of levels for each channel includes between 2 to 8 levels.

6. The method of claim 1, wherein the hardware comprises a Finite State Machine (FSM) configured to perform the combined-feature matching procedure.

7. The method of claim 6, wherein the FSM detects the pattern in the combined stream of levels using regular expressions.

8. A method of generating a digital trigger from multi-channel analog inputs, the method comprising:
   converting an analog input signal on each channel into a respective digital signal;
   comparing signal values of the digital signal on each channel to at least one threshold for each channel to generate a stream of levels for each channel;
   combining the stream of levels for each channel into a combined stream of levels;
   detecting a pattern in the combined stream of levels using regular expressions in a Finite State Machine (FSM) implementing a combined-feature matching procedure; and
   generating the digital trigger according to a result of the combined-feature matching procedure.

9. The method of claim 8, wherein the at least one threshold comprises a plurality of thresholds for each channel.

10. The method of claim 9, wherein different thresholds, of the plurality of thresholds, are selectable for each channel.

11. The method of claim 9, wherein a different number of thresholds, of the plurality of thresholds, are selectable for each channel.

12. The method of claim 8, wherein the stream of levels for each channel includes between 2 to 8 levels.

13. A multi-channel digital trigger device for a measurement instrument, the device comprising:
   an analog to digital converter (ADC) configured to convert analog input signals on each of multiple channels into a respective digital signal;
   a comparator associated with each channel and configured to compare signal values of the digital signal on each channel to at least one threshold to generate a stream of levels for each channel; and
   a multi-channel trigger unit comprising hardware configured to combine the stream of levels for each channel into a combined stream of levels that reflects combined features of the multiple analog input signals, detect a pattern in the combined stream of levels using a combined-feature matching procedure, and generate a trigger according to a result of the combined-feature matching procedure.

14. The digital trigger device of claim 13, wherein the at least one threshold comprises a plurality of thresholds for each channel.

15. The digital trigger device of claim 14, wherein different thresholds, of the plurality of thresholds, are selectable for each channel.

16. The digital trigger device of claim 14, wherein a different number of thresholds, of the plurality of thresholds, are selectable for each channel.

17. The digital trigger device of claim 13, wherein the stream of levels for each channel includes between 2 to 8 levels.

18. The digital trigger of claim 13, wherein the hardware comprises a Finite State Machine (FSM) configured to perform the combined-feature matching procedure.

19. The digital trigger device of claim 18, wherein the FSM is configured to detect the pattern in the combined stream of levels using regular expressions.

* * * * *